US009009636B2

(12) United States Patent
Matsubara

(10) Patent No.: US 9,009,636 B2
(45) Date of Patent: Apr. 14, 2015

(54) ANALOG CIRCUIT SIMULATOR AND ANALOG CIRCUIT VERIFICATION METHOD

(71) Applicant: Fujitsu Limited, Kawasaki-shi, Kanagawa (JP)

(72) Inventor: Satoshi Matsubara, Machida (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/095,142

(22) Filed: Dec. 3, 2013

(65) Prior Publication Data

US 2014/0096096 A1    Apr. 3, 2014

Related U.S. Application Data

(63) Continuation of application No. PCT/JP2011/062981, filed on Jun. 6, 2011.

(51) Int. Cl.
*G06F 17/50* (2006.01)

(52) U.S. Cl.
CPC ................... *G06F 17/5036* (2013.01)

(58) Field of Classification Search
None
See application file for complete search history.

(56) References Cited

U.S. PATENT DOCUMENTS

| | | | | |
|---|---|---|---|---|
| 4,791,593 A * | 12/1988 | Hennion | | 703/14 |
| 5,732,192 A * | 3/1998 | Malin et al. | | 703/2 |
| 7,085,700 B2 * | 8/2006 | O'Riordan et al. | | 703/14 |
| 7,353,157 B2 * | 4/2008 | Wasynczuk et al. | | 703/14 |
| 7,818,158 B2 * | 10/2010 | McDonald et al. | | 703/14 |
| 8,332,193 B2 * | 12/2012 | McKim et al. | | 703/6 |
| 8,341,567 B1 * | 12/2012 | Tiwary et al. | | 716/106 |
| 8,401,828 B1 * | 3/2013 | Bhattacharya et al. | | 703/2 |
| 8,418,098 B2 * | 4/2013 | Huang et al. | | 716/106 |
| 8,434,037 B2 * | 4/2013 | Krishnan | | 716/107 |
| 2007/0078638 A1 * | 4/2007 | McDonald et al. | | 703/14 |
| 2009/0172617 A1 * | 7/2009 | Huang et al. | | 716/5 |
| 2009/0307638 A1 * | 12/2009 | McConaghy | | 716/4 |
| 2010/0131908 A1 * | 5/2010 | Krishnan | | 716/4 |

FOREIGN PATENT DOCUMENTS

| | | |
|---|---|---|
| JP | 3-166751 | 7/1991 |
| JP | 6-124317 | 5/1994 |
| JP | 2001-167140 | 6/2001 |
| JP | 2010-92434 | 4/2010 |

OTHER PUBLICATIONS

Schubert, "An Analog-Node Model for VHDL—Based Simulation of RF Integrated Circuits," IEEE Trans. on Circuits and Systems—I: Regular Papers, vol. 56, No. 12, Dec. 2009, pp. 2717-2727.*

(Continued)

*Primary Examiner* — Leigh Garbowski
(74) *Attorney, Agent, or Firm* — Staas & Halsey LLP

(57) ABSTRACT

An analog circuit simulator includes a processor that is configured to search design data for analog circuits and an analog node connecting the analog circuits; collect variable information that concerns voltage and current variables and is related to input to and output from the analog node; convert the variable information into time functions; and compute the time functions upon each occurrence of a given event and execute simulation of the analog node.

7 Claims, 8 Drawing Sheets

(56) References Cited

OTHER PUBLICATIONS

International Search Report mailed Aug. 30, 2011 in corresponding International Application No. PCT/JP2011/062981.

International Preliminary Report on Patentability issued Dec. 27, 2013 in corresponding International Patent Application No. PCT/JP2011/062981.

* cited by examiner

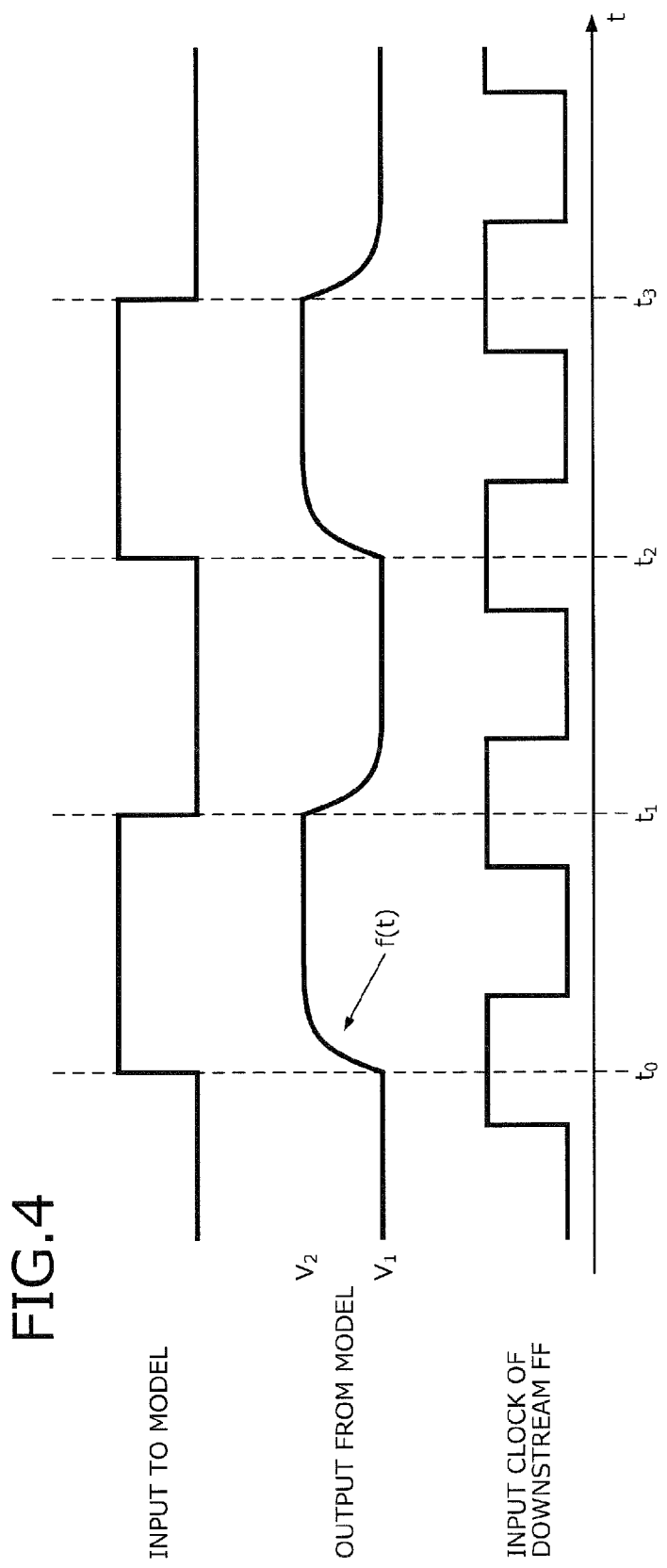

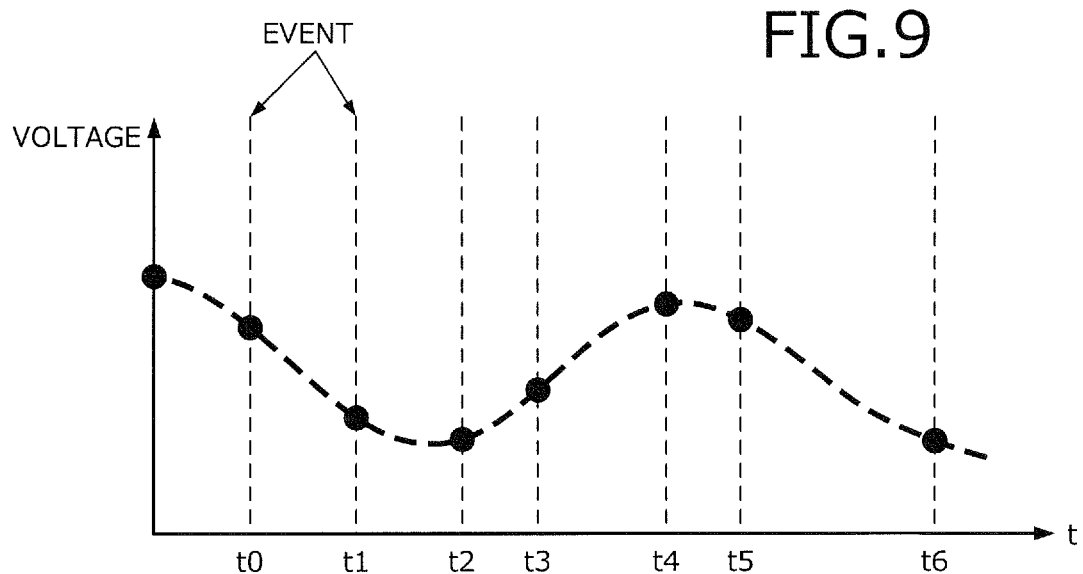

US 9,009,636 B2

ANALOG CIRCUIT SIMULATOR AND ANALOG CIRCUIT VERIFICATION METHOD

CROSS REFERENCE TO RELATED APPLICATIONS

This application is a continuation application of International Application PCT/JP2011/062981, filed on Jun. 6, 2011 and designating the U.S., the entire contents of which are incorporated herein by reference.

FIELD

The embodiment discussed herein is related to an analog circuit simulator and analog circuit verification method that verify analog circuit function.

BACKGROUND

In conventional analog circuit function verification, an analog circuit simulator, such as one with Simulation Program with Integrated Circuit Emphasis (SPICE, registered trademark) is used. Although such analog circuit simulators can calculate analog properties with high accuracy, an enormous amount of memory is used for the computation. Further, since the number of calculation steps is great and each step is detailed, verification using a typical operation model consumes at least several tens of thousands times more time for the verification of large-scale circuits and therefore, such analog circuit simulators cannot be used. As a result, verification using an operation model describing the analog circuit in hardware description language is commonly performed.

For example, concerning matrix constant formularization of circuit partitioning for circuit simulation where a circuit is partitioned into blocks, the partitioned circuit is compiled, current variables of an element that is independent of current variables between nodes outside a block are excluded from internal variables of the block, and simulation is performed (for example, refer to Japanese Laid-Open Patent Publication No. H6-124317). According to another technique, to simulate by numeric computation, the transient state of the waveform of a signal in a circuit having both an analog circuit and digital circuit, the analog circuit is partitioned into circuit blocks and modeled (for example, refer to Japanese Laid-Open Patent Publication No. 2010-92434).

Nonetheless, in the verification of analog circuit function, the analog circuit has to be replaced with an operation model that is of a high level of abstraction and described in hardware description language, and then simulated. However, a problem arises with approaches using hardware description language used for large-scale verification. The directions of signals are clearly defined by input and output definitions and consequently, interactions with elements outside the model, the function of circuits having impedance, and the like cannot be expressed by hardware description language.

For example, in the case of a circuit configuration having a given impedance and in which the input of a grounded resistor is connected to the output of an operational amplifier, if the downstream circuit connected to the output of the operational amplifier is not determined, the voltage/current of the output and input nodes cannot be defined. Thus, analog circuit simulators have been used for verifying circuits having impedance, and a tremendous amount of time is consumed.

SUMMARY

According to an aspect of an embodiment, an analog circuit simulator includes a processor that is configured to search design data for analog circuits and an analog node connecting the analog circuits; collect variable information that concerns voltage and current variables and is related to input to and output from the analog node; convert the variable information into time functions; and compute the time functions upon each occurrence of a given event and execute simulation of the analog node.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a timing chart depicting operation of the simulator;

FIG. 9 is a timing chart depicting discrete modeling of an analog circuit.

DESCRIPTION OF EMBODIMENTS

Figure 1:
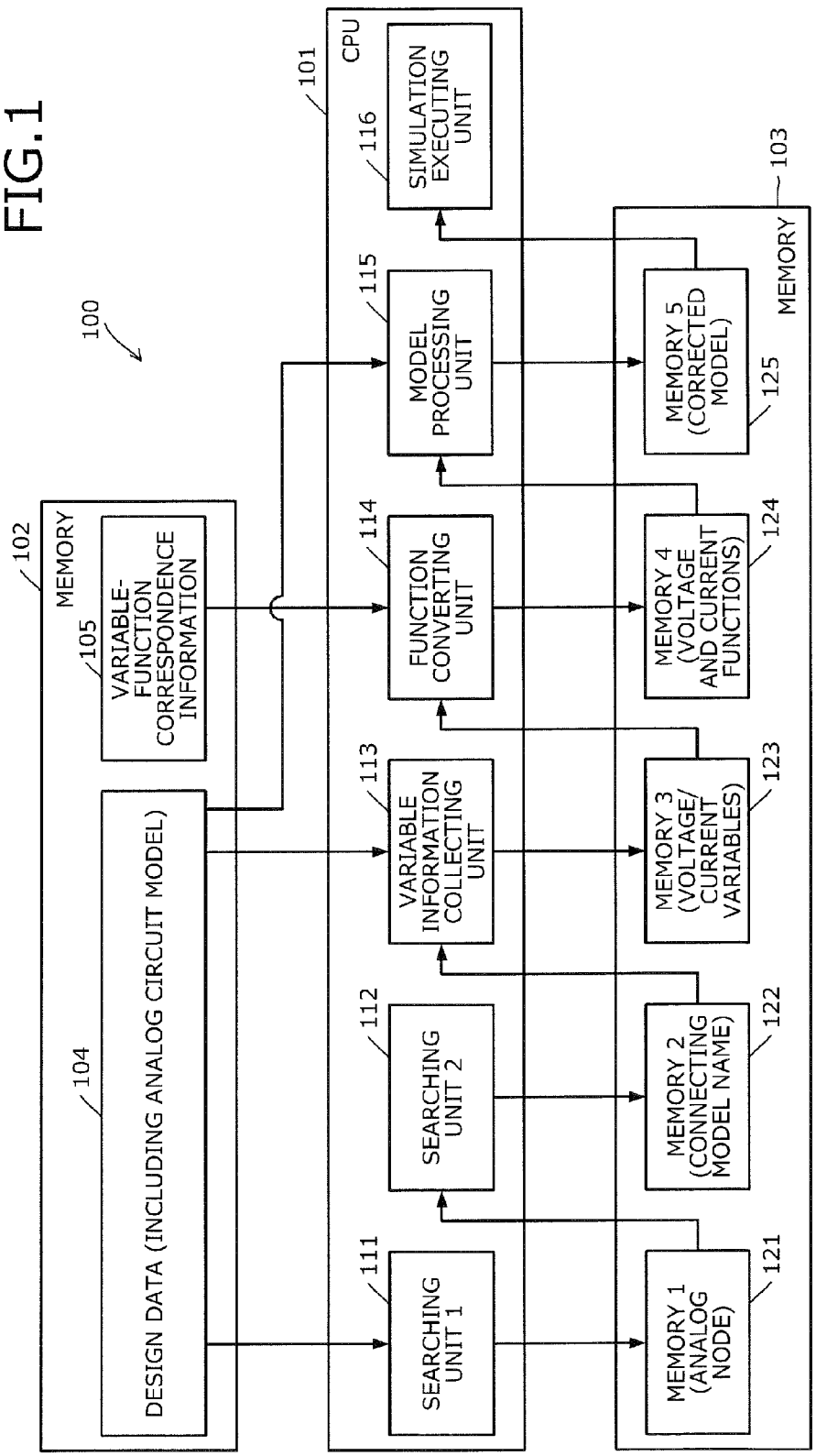
FIG. 1 is a block diagram of an analog circuit simulator according to an embodiment.

Embodiments will be described in detail with reference to the accompanying drawings. FIG. 1 is a block diagram of an analog circuit simulator according to an embodiment. An analog circuit simulator 100 includes a CPU 101, and memory 102, 103. The CPU 101 executes a program (not depicted) that is for analog circuit verification and stored in memory (not depicted) such as ROM and thereby, the CPU 101 causes the device to operate as an analog circuit simulator.

The first memory 102 in the figure stores design data 104 and variable-function correspondence information 105 of a circuit under design. The design data 104 is formed by the digital circuit model and the analog circuit model included in the circuit.

The CPU 101, consequent to the execution of a program, has functions including reading out the design data 104, modeling the circuit, and performing simulation. Description will be given according to function. A searching unit 1 (111) reads out the design data 104 such as a netlist, searches for the analog circuit at the highest layer of the circuit under verification, further searches for an analog node that connects analog ports (the output of an upstream analog circuit and the input of a downstream analog circuit), and stores to memory 1 (121), an extracted analog node.

A searching unit 2 (112) sequentially searches for analog nodes stored to the memory 1 (121), searches for model names correlated with the respective analog nodes, and stores the obtained model names into the memory 2 (122).

A variable information collecting unit 113 collects from a variable information group that corresponds to preliminarily prepared models, variable information that corresponds to the model names stored in the memory 2 (122) and stores the collected variable information into memory 3 (123). The variable information is formed from voltage variables and current variables that correspond to the model names and that are preliminarily defined. The variable information collecting unit 113 stores to the memory 3 (123), the variable information (voltage variable and current variable) that corresponds to the model names.

A function converting unit 114 reads out from the memory 3 (123), the variable information (voltage variable and current variable) correlated with the model names, and based on the variables, performs conversion to a pre-defined time function. Since circuit configuration is determined from the voltage variable and current variable information of the model, the function converting unit 114 determines the time function of the voltage and the current corresponding to the model. The function converting unit 114 converts the voltage and the current of the analog node into a time function and stores the resulting function into the memory 4 (124). A process for conversion to a function is not absolutely necessary and configuration may be such that functions corresponding to plural models are prepared in advance and from which a function for a model is selected.

A model processing unit 115 reads out from the memory 4 (124), current and voltage functions, and to obtain the values of the current and of the voltage of the model when a given event occurs, the model processing unit 115 extracts from among the functions obtained by the function converting unit 114, only values at the time when the event occurred. The time when the given event occurs refers to, for example, an output of the current value and the voltage value of the model to the simulation executing unit 116 when an event occurs at the next stage of the model during a simulation performed by a simulation executing unit 116. For example, coinciding with the cycle operation of the analog circuit operation of the model, the model processing unit 115 extracts only functions of the voltage value and the current value at the start of the cycle operation of a downstream FF circuit. The corrected model is stored to the memory (125).

The simulation executing unit 116 executes simulation for functional verification of an analog circuit, and using the corrected model stored in memory (125), performs computations based on functions of the values of the voltage and of the current only at the time when an event occurs. For example, the simulation executing unit 116 can use a model described in a hardware description language such as general-purpose Verilog to perform simulation. However, the simulation executing unit 116 performs analysis only when an event occurs and does not perform continuous analysis of transient states in the analog circuit. As result, for an analog circuit, event driven voltage and current analysis that considers impedance (voltage and current) while being temporally discrete is performed as well as fast functional verification.

Figure 2:
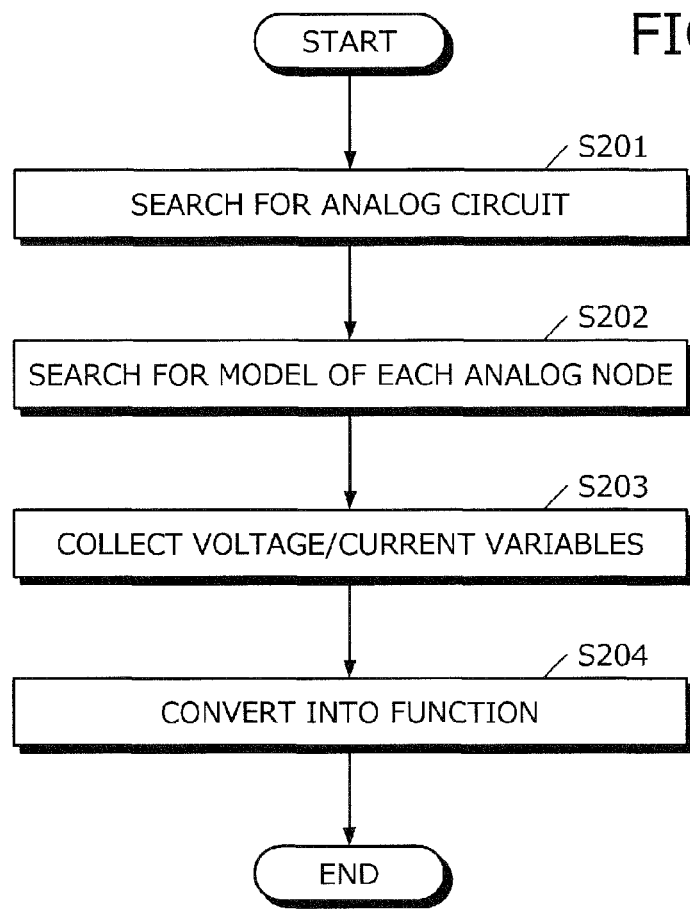
FIG. 2 is a flowchart of a process operation of the analog circuit simulator according to the embodiment.

FIG. 2 is a flowchart of a process operation of the analog circuit simulator according to the embodiment. The process depicted in FIG. 2 describes a preprocess that is performed prior to the execution of the simulation at the simulation executing unit 116. The searching unit 1 (111) reads the design data 104 from the memory 102, searches for an analog circuit at the highest layer of the circuit under verification, and further searches for an analog node that connects analog ports (upstream output and downstream input) (step S201). Each extracted analog node is stored to the memory 1 (121).

The searching unit 2 (112) sequentially searches for analog nodes stored in the memory 1 (121), and searches for model names correlated with the respective analog nodes (step S202). The searching unit 2 (112) stores the obtained model names into the memory 2 (122).

The variable information collecting unit 113 collects variable information that corresponds to the model names stored in the memory 2 (122) (step S203). The variable information collecting unit 113 stores the collected variable information into the memory 3 (123).

The function converting unit 114 reads out from the memory 3 (123), variable information (voltage variable and current variable) correlated with the model names, and performs conversion to a pre-defined time function (step S204). Thus, the voltage and current of the converted analog node are converted into time functions and the resulting functions are stored to the memory 4 (124), thereby ending the pre-process.

After the pre-process, execution of the simulation at the simulation executing unit 116 is performed. The model processing unit 115 reads out from the memory 4 (124), the current and voltage functions, and each time a given event occurs, the function converting unit 114 from among the obtained functions, outputs to the simulation executing unit 116, a value at the time when the event occurred. Thus, the simulation executing unit 116 suffices to have a general-purpose simulator function, and is able to execute computations based on functions of the values of the voltage and of the current at the time when an event occurs and output a computation result.

As described, according to the present embodiment, the analog circuit simulator is implemented by an association of an analog circuit model and a simulator.

1-1. In the analog circuit model, a voltage variable and current variable are provided to the analog ports of each analog circuit.

1-2. At the highest layer of the circuit under verification, an analog node that connects analog ports is searched for.

1-3. From voltage variable and current variable relations of all models connected to the analog nodes, voltage and current of the analog node are converted into time functions.

2. At the simulator, when an event occurs, necessary analog values (voltage value, current value) are calculated by a function and a verification result is obtained.

Figure 3:
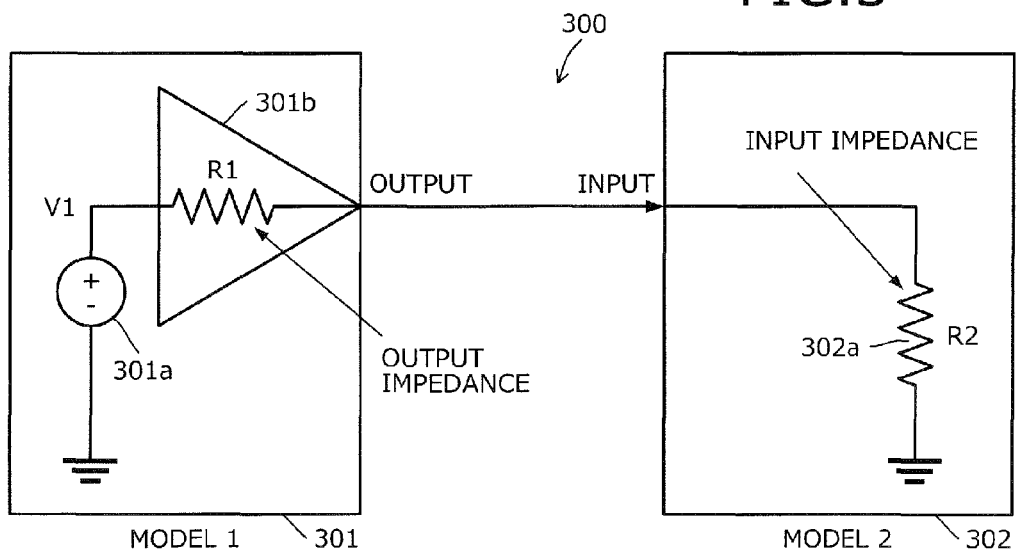
FIG. 3 is a diagram depicting an example of an analog model.

Details of the processes of the above units will be described. First the analog model will be described. FIG. 3 is a diagram depicting an example of the analog model. A model 300 depicted in the figured is an example where the analog port_input of a model 2 (302) having a grounded resistor 302a is connected to the analog port_output of a model 1 (301) that includes a power source 301a and an operational amplifier 301b. In the model 300, R2 is input impedance, and R1 is output impedance. The searching unit 1 (111) to the variable information collecting unit (113) search for and obtain voltage variable V1−(I1×R1) and a current variable I1 for the output port of the model 1. Further, concerning the input port of the model 2, the voltage variable I2×R2 and a current variable I2 are obtained.

FIG. 4 is a timing chart depicting operation of the simulator. As depicted by the model 300 in FIG. 3, a case where variation of the voltage and of the current remains within 1 cycle, when simulation is executed by the simulation executing unit 116 will be described as an example. Transient voltage variation V(t) at this time is expressed by the following function.

$$V(t) = V1 + (V2-V1)[\tfrac{1}{2} + (ft-tk) - \tfrac{1}{2}) \times (-1)^k] \quad (5)$$

Consequent to input to the model 300, the output with respect to reference voltage V1, the voltage transiently increases up to V2 according to an RC property function. Here, coinciding with every 1-cycle, which corresponds to the rising edge of a clock input to a downstream FF, the simulation executing unit 116 suffices to calculate the values of the above functions only at times t0, t1, t2, t3, . . . regarded as the time of the occurrence of an event. Thus, the simulation executing unit 116 does not calculate transient properties entirely, but rather according to the processed models stored in the memory (125) and performs the function computation f(t) only at the time of a designated event t0, t1, t2, t3, . . . , whereby the calculation by the simulation executing unit 116 can be performed easily and with a low load.

Another example of an application with respect to the model will be described. When simulation is executed and variation of the voltage and of the current (function values) occurs over plural cycles, affecting other cycles, the following function is used. 1. A case when the effect continues infinitely is expressed by the equation below. (−1) corresponds to waveform inversion.

$$V_n(t) = V_1 + (V_2 - V_1) \sum_{k=0}^{n} f(t - t_k) * (-1)^k \quad (1)$$

A case where the effect continues for 3 cycles is calculated by $$Vn(t) = V1 + (V2-V1)(-1)^n(f(t-t_n) - f(t-t_{n-1}) + f(t-t_{n-2}))$$

In this manner, addition of the function corresponding in number to the number of cycles that are affected suffices.

Figure 5A:
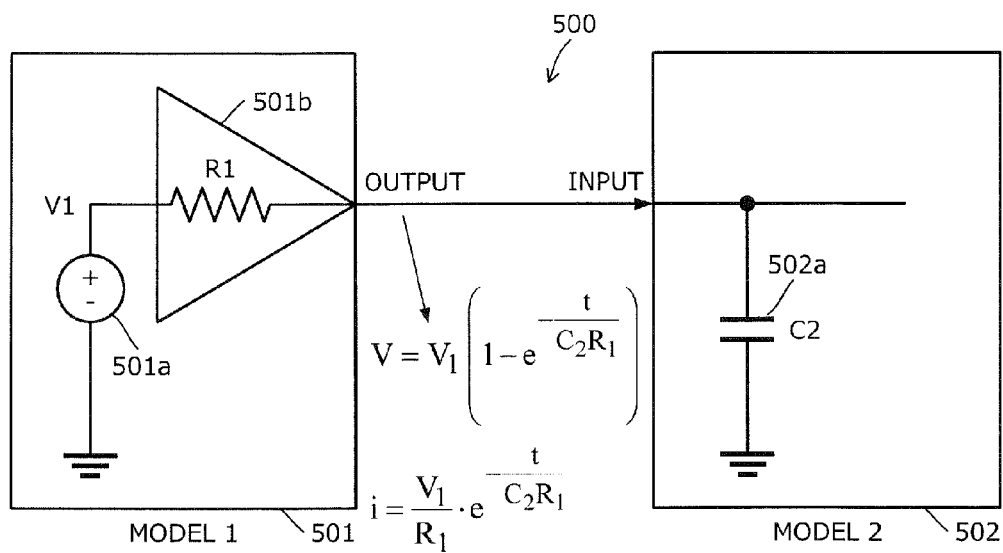
FIG. 5A is a circuit diagram of an example of formularization of a model.

FIG. 5A is a circuit diagram of an example of formularization of a model. A model 500 depicted in the figure is an example where the analog port_input of a model 2 (502) having a grounded capacitor 502a is connected to the analog port_output of a model 1 (501) that includes a power source 501a and an operational amplifier 501b. In this example, the model 500 is configured by output impedance R1 and total capacitance C2. The searching unit 1 (111) to the variable information collecting unit (113) search for and obtain the voltage variable V1−I1×R1 and the current variable I1 for the output port of the model 1. Further, concerning the input port of the model 2, the voltage variable I2/jωC2 and the current variable I2 are searched for and obtained. The function converting unit 114 performs conversion into a function for an upper layer.

Figure 5B:
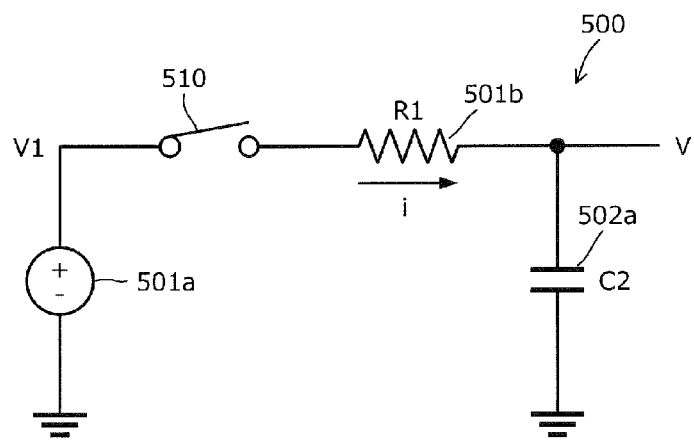
FIG. 5B is a diagram describing formularization of an upper layer in FIG. 5A.
Figure 5C:
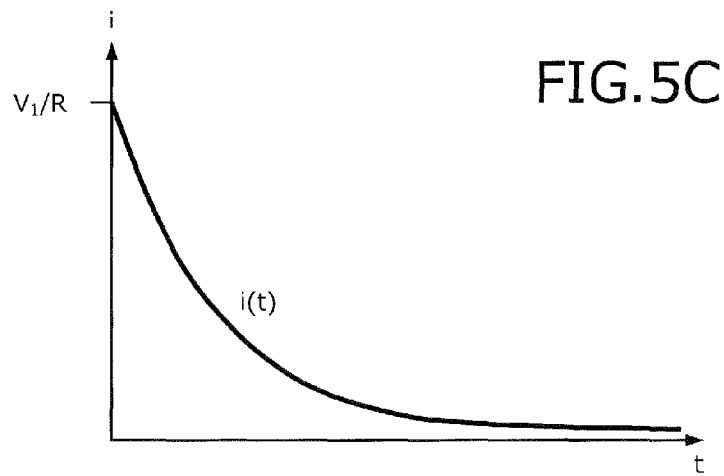
FIG. 5C is a diagram depicting the waveform of current in FIG. 5B.

FIG. 5B is a diagram describing formularization of the upper layer in FIG. 5A. FIG. 5C is a diagram depicting the waveform of the current in FIG. 5B. As depicted in FIG. 5B, in the function expressed by the upper layer, the power source 501a is connected to the resistor R1 via a switch 510 and the grounded capacitor C2 becomes connected. The voltage V1 of the model 500 may be expressed as:

$$V_1 = R_1 i + \frac{1}{C_2} \int i\, dt \quad (2)$$

Where, the following are obtained by deriving both terms:

$$R_1(di/dt) + 1/C_2 \cdot i = 0$$

$$1/i \cdot (di/dt) = -1/C_2 R_1$$

The following are obtained by integrating both terms:

$$\ln|i| = -t/C_2 R_1 + A \quad (A: \text{constant of integration})$$

$$i = e^A \cdot e^{-(t/C2R1)}$$

$$i = \frac{V_1}{R_1} \cdot e^{-\frac{t}{C_2 R_1}} \quad (3)$$

from V=V1−Ri, $$V = V_1 \left(1 - e^{-\frac{t}{C_2 R_1}}\right) \quad (4)$$

is obtained. The function converting unit 114 respectively converts the voltage V and the current i into time functions. When simulation is executed by the simulation executing unit 116, at the time when an event at the next stage occurs (refer to FIG. 4), values obtained by an application of the above functions are output as output of the model and the simulation executing unit 116 is caused to execute the simulation. The switch 510 depicted in FIG. 5B is operated to open/close at each occurrence of an event, whereby the waveform of the output of the model in FIG. 4 is obtained.

Figure 6:
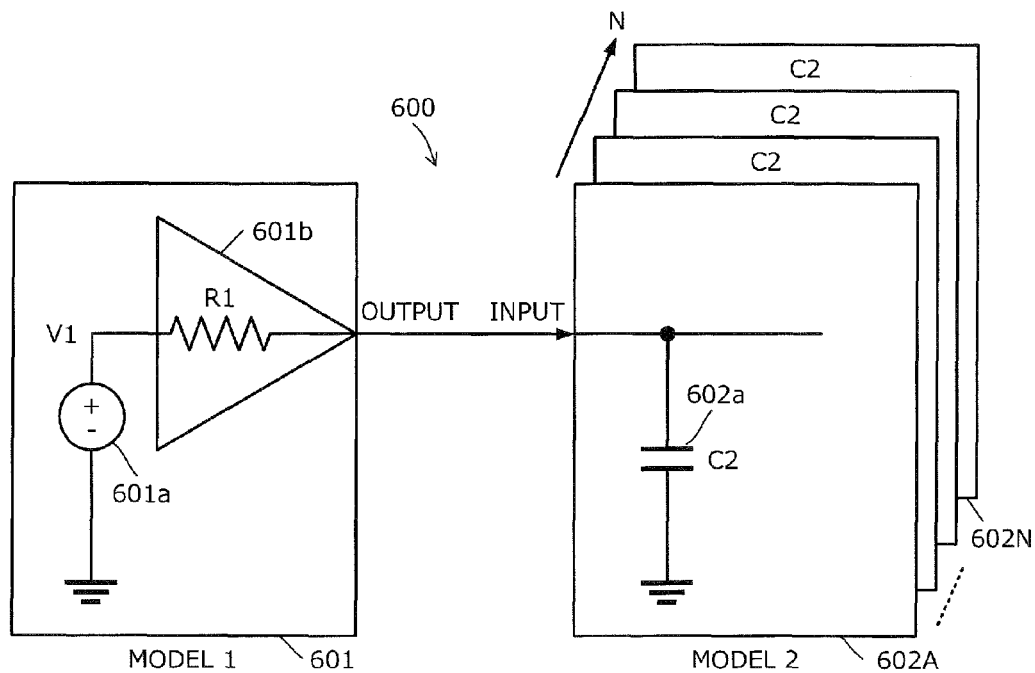
FIG. 6 of is a circuit diagram of another example of formularization of a model.

FIG. 6 of is a circuit diagram of another example of formularization of a model. A model 600 depicted in the figure is an example where as the analog port_input of the model 2 (602A-602N), parallel N capacitors 602a are connected to the analog port_output of the model 1 (601) that includes a power source 601a and an operational amplifier 601b. Thus, in a case of parallel connection, the model 2 suffices to be formularized by the sum C of the capacitance of the capacitors 602a. In other words, capacitance C=C2×N. Thus, the function converting unit 114 converts the voltage V and the current i into the time functions below.

$$V = V_1 \left(1 - e^{-\frac{t}{C R_1}}\right) \quad (5)$$

$$i = \frac{V_1}{R_1} \cdot e^{-\frac{t}{C R_1}} \quad (6)$$

Figure 7A:
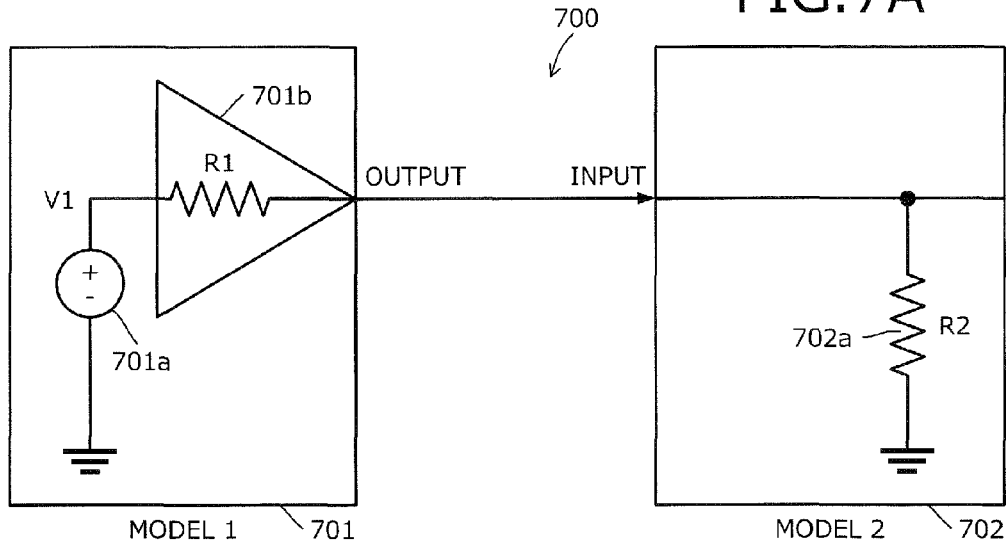
FIG. 7A is a circuit diagram of yet another example of formularization of a model.

FIG. 7A is a circuit diagram of yet another example of formularization of a model. A model 700 depicted in the figure is an example where the analog port_input of the model 2 (702) having a grounded voltage divider resistor 702a is connected to the analog port_output of the model 1 (701) that includes a power source 701a and an operational amplifier 701b. The searching unit 1 (111) to the variable information collecting unit (113) search for and obtain the voltage variable V1−I1×R1 and the current variable I1 for the output port of the model 1. Further, the voltage variable I2×R2 and the current variable I2 are searched for and obtained for the input port of the model 2. The function converting unit 114 performs conversion into a function for an upper layer.

Figure 7B:
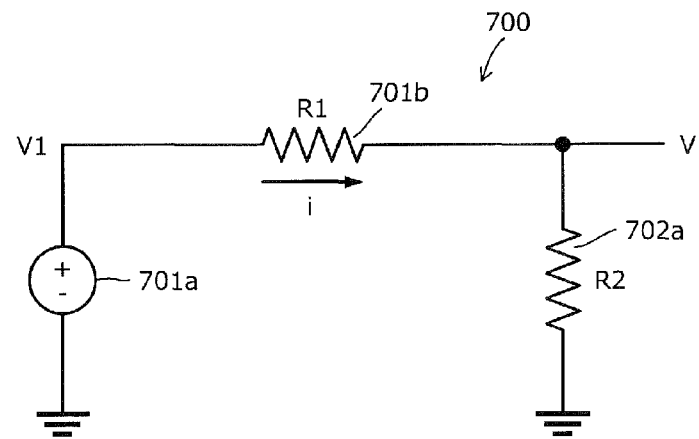
FIG. 7B is a diagram describing formularization of an upper layer in FIG. 7A.
Figure 7C:
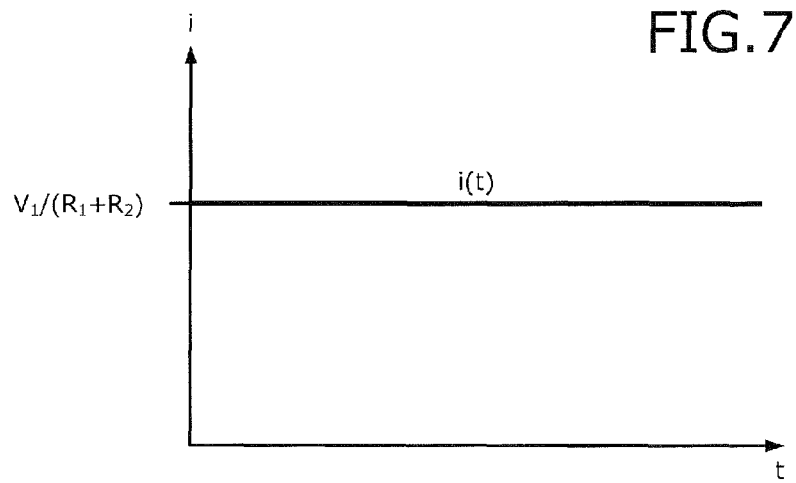
FIG. 7C is a diagram depicting the waveform of current in FIG. 7B.

FIG. 7B is a diagram describing formularization of the upper layer in FIG. 7A. FIG. 7C is a diagram depicting the waveform of the current in FIG. 7B. The model 700 depicted in FIG. 7B is expressed as:

voltage $V=(R2 \cdot V1)/(R1+R2)$ current $i=V1/(R1+R2)$

The function converting unit 114 uses the above current i and voltage V as functions. As depicted in FIG. 7C, the model 700 becomes a value where the current and the voltage are a time-independent DC value (a value not dependent on time).

Figure 8:
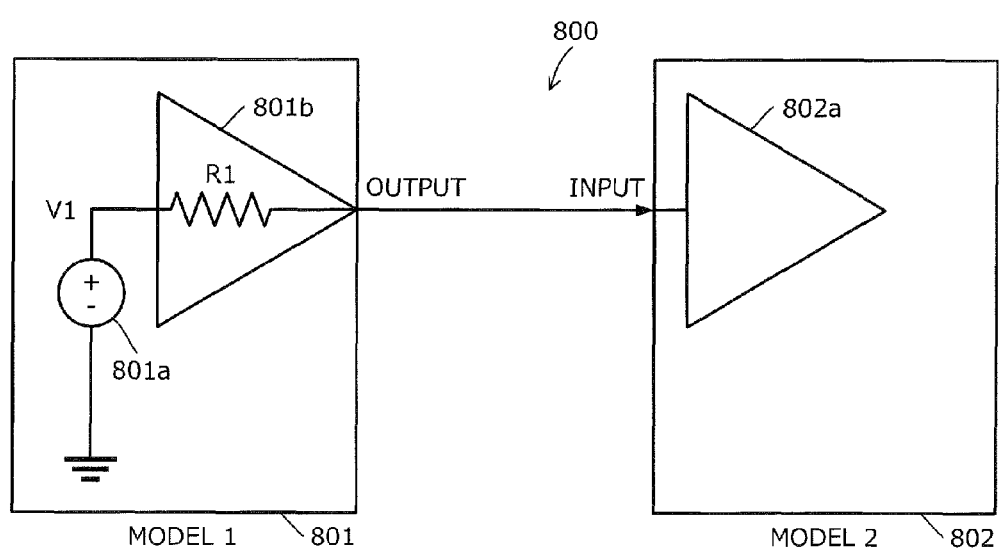
FIG. 8 is a diagram of yet another example of formularization of a model.

FIG. 8 is a diagram of yet another example of formularization of a model. A model 800 depicted in the figure is an example where the analog port_input of the model 2 (802) of an operational amplifier 802a to which no load is input, is connected to the analog port_output of the model 1 (801) that includes a power source 801a and an operational amplifier 801b. Thus, for models where a node is not affected by impedance or in cases where the calculation of impedance is unnecessary, such as with the model 800, formularization is applicable. In this manner, when impedance computation is unnecessary, the output of the model can be used as is.

In the case of the configuration in FIG. 8, the searching unit 1 (111) to the variable information collecting unit (113) suffice to search for and obtain the voltage variable V=V1 and the current variable i=V1/R1 for the output port of the model 1. The function converting unit 114 may use, as a function for the upper layer, the voltage and the current of the output port of the model 1 as is.

FIG. 9 is a timing chart depicting discrete modeling of an analog circuit. As described above, temporal discrete modeling is performed for an analog circuit having impedance, by the configuration of the searching unit 1 (111) to the model processing unit 115. Thus, since the simulation executing unit 116 suffices to perform computations only at the occurrence of an event, the time consumed for verification is significantly reduced. With conventional simulation (e.g., Verilog-A), verification is performed with respect to voltage variations expressed on the vertical axis and continuously for time expressed on the horizontal axis depicted in FIG. 7. On the contrary, for the output of the model upstream, in the embodiment above, by discrete modeling of the analog circuit, calculation of values (as output) obtained by an application of the obtained functions suffices to be performed only when an event occurs such as at the operation timing of a downstream circuit (FF) (at each point depicted in the figure). Thus, the time consumed for verification may be significantly reduced.

According to the disclosed technique, an analog circuit is modeled, and for a circuit that has impedance when input/output ports are connected, variables of the current and of the voltage are collected, and at an upper layer, the current and the voltage are converted into functions that vary temporally. Thus, functions of an analog circuit that has impedance may be easily and quickly verified. Further, by performing simulation computations when an event occurs, the time consumed for verification may be significantly reduced. Thus, functions of large-scale mixed signal designs that include not only digital circuits but also analog circuits may be verified. Further, functions of an analog circuit may be verified by a general-purpose simulation computation technique.

The analog circuit simulator and analog circuit verification method enable simple and fast functional verification of analog circuits having impedance.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog circuit simulator comprising
a processor that is configured to:
search design data for a plurality of analog circuits and search for an analog node connecting an output of an upstream analog circuit and an input of a downstream analog circuit;
collect variable information that concerns voltage and current variables and is related to input to and output from the analog node;
convert the variable information into time functions; and
compute the time functions upon each occurrence of a given event and execute simulation of the analog node.

2. The analog circuit simulator according to claim 1, wherein
the processor uses a model name that corresponds to the analog node that has been preliminarily prepared and the variable information concerning voltage and current to search for the variable information corresponding to the model name.

3. The analog circuit simulator according to claim 1, wherein
the processor sums the variable information that concerns voltage and current and is related to the analog node expressed by an upper layer of the model, and converts the variable information into preliminarily prepared time functions corresponding to the variable information.

4. The analog circuit simulator according to claim 1, wherein
the processor computes the time functions at each occurrence of an event in a circuit downstream from the analog node.

5. The analog circuit simulator according to claim 4, wherein
the processor performs computation at each occurrence, when a function value of the analog node converges within 1 occurrence of the event.

6. The analog circuit simulator according to claim 4, wherein
the processor, when a function value of the analog node converges over plural occurrences of the event, performs computation by adding functions corresponding in number to the number of occurrences over which the function value converges.

7. An analog circuit verification method that is executed by a processor, the analog circuit verification method comprising:
searching design data for a plurality of analog circuits and an searching for an analog node that connects an output of an upstream analog circuit and an input of a downstream analog circuit;
collecting variable information that concerns voltage and current variables and is related to input to and output from the analog node;
converting the variable information into time functions; and
computing the time functions upon each occurrence of a given event and executing simulation of the analog node.

* * * * *